(12) United States Patent
Chou et al.

(10) Patent No.: US 11,450,597 B2
(45) Date of Patent: Sep. 20, 2022

(54) SEMICONDUCTOR PACKAGE SUBSTRATE HAVING HEAT DISSIPATING METAL SHEET ON SOLDER PADS, METHOD FOR FABRICATING THE SAME, AND ELECTRONIC PACKAGE HAVING THE SAME

(71) Applicant: PHOENIX PIONEER TECHNOLOGY CO., LTD., Hsinchu County (TW)

(72) Inventors: Pao-Hung Chou, Hsinchu County (TW); Chun-Hsien Yu, Hsinchu County (TW); Shih-Ping Hsu, Hsinchu County (TW)

(73) Assignee: PHOENIX PIONEER TECHNOLOGY CO., LTD., Hsinchu County (TW)

( * ) Notice: Subject to any disclaimer, the term of this patent is extended or adjusted under 35 U.S.C. 154(b) by 0 days.

(21) Appl. No.: 16/897,372

(22) Filed: Jun. 10, 2020

(65) Prior Publication Data

US 2020/0388564 A1    Dec. 10, 2020

(30) Foreign Application Priority Data

Jun. 10, 2019    (TW) .................................. 108119907

(51) Int. Cl.
*H01L 23/498*    (2006.01)
*H01L 21/48*    (2006.01)
*H01L 23/367*    (2006.01)
*H01L 23/00*    (2006.01)

(52) U.S. Cl.
CPC .... *H01L 23/49838* (2013.01); *H01L 21/4853* (2013.01); *H01L 23/367* (2013.01); *H01L 23/49816* (2013.01); *H01L 24/73* (2013.01); *H01L 2224/73204* (2013.01)

(58) Field of Classification Search
CPC ......... H01L 23/49838; H01L 23/49816; H01L 24/73; H01L 21/4853; H01L 23/367
See application file for complete search history.

(56) References Cited

U.S. PATENT DOCUMENTS

| | | | |
|---|---|---|---|
| 2005/0062147 A1* | 3/2005 | Wakisaka | H01L 23/49816 257/712 |
| 2007/0262441 A1* | 11/2007 | Chen | H01L 24/82 257/706 |
| 2008/0210459 A1* | 9/2008 | Lin | H05K 1/0271 174/255 |

(Continued)

*Primary Examiner* — Michael Jung
(74) *Attorney, Agent, or Firm* — Amin, Turocy & Watson, LLP

(57) ABSTRACT

A semiconductor package substrate, a method for fabricating the same, and an electronic package having the same are provided. The method includes: providing a circuit structure having a first solder pad and a second solder pad; forming on the circuit structure a metal sheet having a first hole, from which the first solder pad is exposed, and a second hole, from which the second solder pad is exposed; and forming an insulation layer on the metal sheet and a hole wall of the second hole. A first conductive element that is to be grounded is disposed in the first hole and is in contact with the metal sheet and the first solder pad. Therefore, heat generated in a signal transmission process is dissipated by the metal sheet and the first conductive element.

8 Claims, 4 Drawing Sheets

(56) References Cited

U.S. PATENT DOCUMENTS

| | | | | |
|---|---|---|---|---|
| 2013/0342231 A1* | 12/2013 | Alfano | ............... | H05K 1/0268 |
| | | | | 324/750.16 |
| 2015/0060114 A1* | 3/2015 | Park | ............... | H05K 1/115 |
| | | | | 174/254 |
| 2019/0371704 A1* | 12/2019 | Wang | ............... | H01L 23/467 |

* cited by examiner

SEMICONDUCTOR PACKAGE SUBSTRATE HAVING HEAT DISSIPATING METAL SHEET ON SOLDER PADS, METHOD FOR FABRICATING THE SAME, AND ELECTRONIC PACKAGE HAVING THE SAME

CROSS-REFERENCE TO RELATED APPLICATIONS

This application claims priority to Taiwanese Application Serial No. 108119907, filed on Jun. 10, 2019. The entirety of the application is hereby incorporated by reference herein and made a part of this specification.

BACKGROUND

1. Technical Field

The present disclosure relates to package substrates, and, more particularly, to a carrier substrate that can dissipate heat and an electronic package having the carrier substrate.

2. Description of the Prior Art

In recent years, more and more large size chips, such as artificial intelligence (AI) chips, advanced chips, or stacked chips have come to the market. Accordingly, sophisticated fabrication processes, such as 3D or 2.5D IC fabrication process, are developed and applied to advanced products, such as AI chips, GPU, etc., which require high density circuits/high transmission speed/high number of stacked layer/large size.

Accordingly, fabricators use a large-sized flip-chip package substrate, such as one with board size of 40*40, 70*70, or more, to carry the AI chips, advanced chips or stacked chips, which have a large size.

As shown in FIG. 1A, an electronic package 1 according to the prior art comprises a package substrate 1a and a semiconductor chip 19 bonded onto the package substrate 1a. The package substrate 1a includes a core layer 10, a circuit built-up layer 11 formed on the core layer 10, and a solder resist layer 12 formed on the circuit built-up layer 11. The solder resist layer 12 is exposed from an outermost one of circuit layers of the circuit built-up layer 11 and is used as contacts (i.e., I/O) 11a and 11b, for the semiconductor chip 19 to be mounted on an upper side thereof via solder bumps 13a and a circuit board (not shown) to be mounted on a lower side thereof (e.g., the ball planting side or BGA shown in FIG. 1B) via solder balls 13b.

In the fabrication of the core layer 10, a substrate composed of glass fiber and epoxy resin is used, such as bismaleimide triazine (BT), FR4, FR5 etc., a via formation process, such as mechanically drilling, laser drilling or dual-cone-shaped-via processes, is performed on the substrate, and an electroplating process is performed on the vias to form conductive portions 100. The circuit built-up layer 11 is formed by using ABF as a dielectric layer. The solder resist layer 12 is made of solder resist or solder ink.

The signals of the package substrate 1a are transmitted from the solder bumps 13a, through the contacts 11a, the circuit built-up layer 11, the conductive portions 100, the circuit built-up layer 11 and the contacts 11b to the solder balls 13b (or in a reverse order). When the signals are transmitted, heat is generated and is dissipated by a metal material (e.g., a copper circuit surface of the circuit built-up layer 11) and a dielectric material of the package substrate 1a.

However, the heat dissipating efficiency of the package substrate 1a is poor, and the heat will accumulate in the package substrate 1a, which heats up the whole electronic package 1 and affects the overall performance (e.g., reducing the transmission speed and calculation speed) and lifespan of the electronic package 1. The package substrate 1a does not meet the heat dissipating requirement.

Therefore, how to solve the problems of the prior art is becoming an urgent issue in the art.

SUMMARY

In view of the drawbacks of the prior art, the present disclosure provides a semiconductor package substrate, comprising: a circuit structure having a chip mounting side and a ball planting side opposing the chip mounting side, the circuit structure comprising: at least one dielectric layer; and a circuit layer formed on the dielectric layer, wherein the circuit layer on the ball planting side includes a plurality of first solder pads and a plurality of second solder pads; a metal sheet having a plurality of first holes for the first solder pads to be exposed therefrom, and a plurality of second holes for the second solder pads to be exposed therefrom; a bonding material bonding the metal sheet onto the ball planting side of the circuit structure; and an insulation layer formed on the metal sheet and a hole wall of each of the second holes, and being free from being formed on a hole wall of each of the first holes.

The present disclosure further provides a method for fabricating a semiconductor package substrate, comprising: providing a circuit structure having a chip mounting side and a ball planting side opposing the chip mounting side, wherein the circuit structure comprises: at least one dielectric layer; a circuit layer formed on the dielectric layer; and a plurality of first solder pads and a plurality of second solder pads disposed on the circuit layer on the ball planting side; bonding a metal sheet onto the ball planting side of the circuit structure via a bonding material; forming on the metal sheet a plurality of first holes for the first solder pads to be exposed therefrom, and a plurality of second holes for the second solder pads to be exposed therefrom; forming an insulation layer on the ball planting side of the circuit structure and the metal sheet; and removing a portion of the insulation layer on the first solder pads in the first holes and the second solder pads in the second holes, with the first and second solder pads exposed from the first and second holes, respectively, and the insulation layer remained on a hole wall of each of the second holes.

In an embodiment, a plurality of conductive bumps are disposed on the chip mounting side of the circuit structure and bonded to at least one electronic component.

In an embodiment, a plurality of first conductive elements are disposed on the first solder pads in the first holes and are in contact with the metal sheet.

In an embodiment, a plurality of second conductive elements are disposed on the second solder pads in the second holes and are in contact with the insulation layer and in no contact with the metal sheet.

The present disclosure further provides an electronic package, comprising: the above-described semiconductor package substrate; and at least an electronic component disposed on the chip mounting side of the circuit structure.

In an embodiment, an encapsulation layer is formed on the semiconductor package substrate and bonds the electronic component to the semiconductor package substrate.

In an embodiment, the electronic component is disposed via a plurality of conductive bumps on the chip mounting side of the circuit structure.

It is known from the above that in the semiconductor package substrate, the method for fabricating the same, and the electronic package having the same according to the present disclosure, the insulation layer is not formed in the first hole of the metal sheet, and the first conductive element that is used to be grounded can be in contact with the metal sheet. Therefore, the heat generated during a signal transmission process can be dissipated not only by the metal material and dielectric material of the semiconductor package substrate, but also by the metal sheet and the first conductive element. Compared with the prior art, the present disclosure prevents the heat from being accumulated in the semiconductor package substrate, so as to avoid overheating the entire electronic package. Therefore, the semiconductor package substrate meets the heat dissipating requirement, which ensures the overall performance and lifespan of the electronic package.

BRIEF DESCRIPTION OF THE DRAWINGS

FIG. 2D' is a bottom view of FIG. 2D.

DETAILED DESCRIPTION

The following illustrative embodiments are provided to illustrate the present disclosure, these and other advantages and effects can be apparently understood by those in the art after reading the disclosure of this specification.

It should be appreciated that the structures, proportions, size and the like of the figures in the present disclosure are intended to be used in conjunction with the disclosure of the specification. They are not intended to limit the invention and therefore do not represent any substantial technical meanings. The details of the specification may be on the basis of different points and applications, and numerous modifications and variations can be devised without departing from the spirit of the present disclosure. As used herein, the terms "over," "first," "second," "a" and the like, are used to distinguish one element from another, and are not intended to limit the scope of the present disclosure. Changes or adjustments are considered to be within the scope of the present disclosure, without departing from the scope of the present disclosure.

FIGS. 2A to 2E are cross-sectional views illustrating a method for fabricating an electronic package 4 and a semiconductor package substrate 2 according to the present disclosure.

Figure 1A:
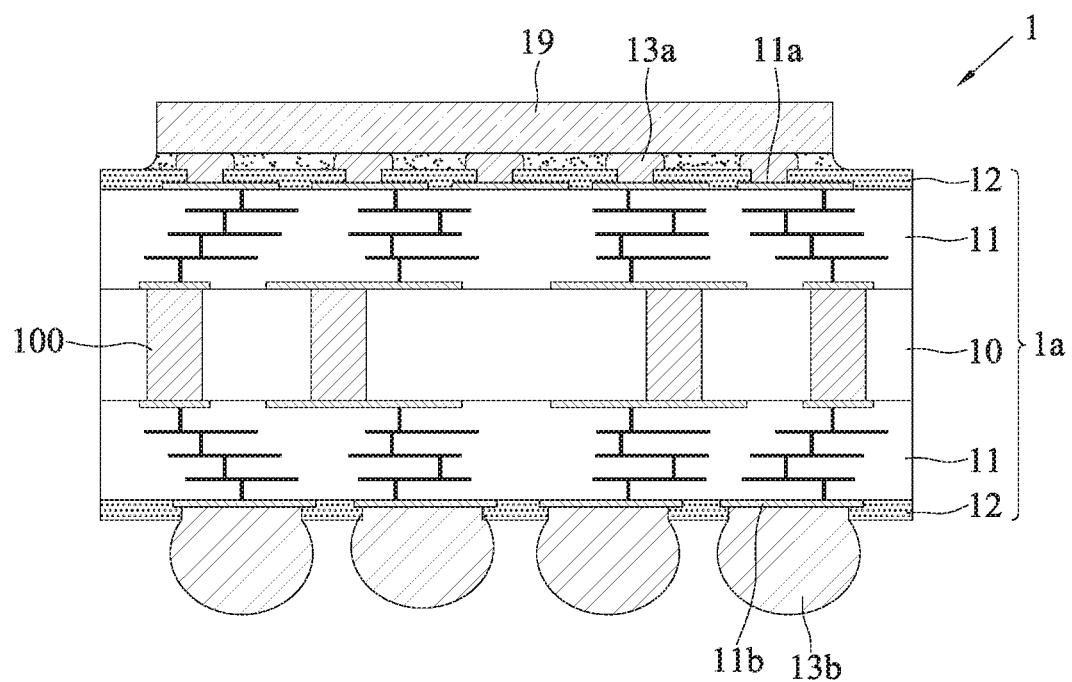
FIG. 1A is a cross-sectional view of an electronic package according to the prior art.
Figure 1B:
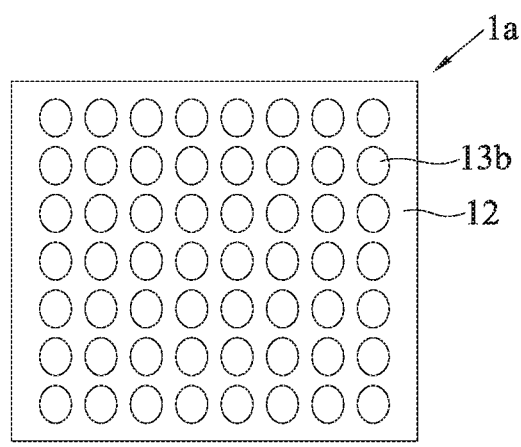
FIG. 1B is a bottom view of FIG. 1A.
Figure 2A:
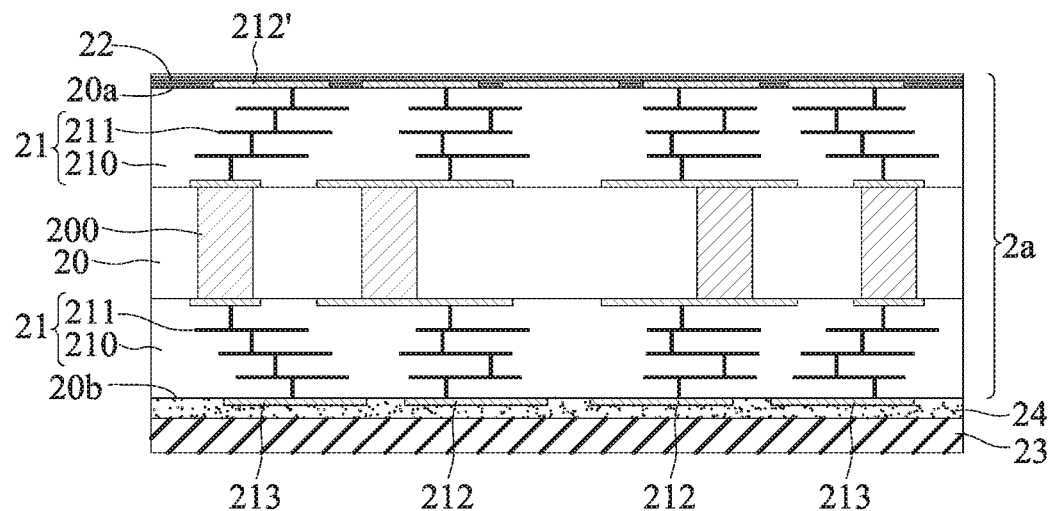
FIGS. 2A to 2E are cross-sectional views illustrating a method for fabricating an electronic package according to the present disclosure.

As shown in FIG. 2A, a circuit structure 2a is provided. The circuit structure 2a has a chip mounting side 20a and a ball planting side 20b opposing the chip mounting side 20a, on both of which an electronic component (e.g., a semiconductor chip, a passive element etc.) can be disposed. The chip mounting side 20a is an externally mounting side where a semiconductor chip is mounted.

In an embodiment, the circuit structure 2a comprises a core layer 20 and a plurality of conductive portions 200 formed therein. In an embodiment, the core layer 20 is made of a substrate composed of glass fiber and organic resin, such as bismaleimide triazine (BT), FR4, FR5 etc., or is made of a highly rigid organic substrate having a filler (e.g., $SiO_2$) and without glass fiber. A via formation process, such as mechanically drilling, laser drilling etc., is then performed on the substrate, and the conductive portions 200 are formed in the via. In another embodiment, the core layer 20 is a core substrate formed by an organic insulation material, such as an ajinomoto build-up film (ABF), a prepreg with or without glass fiber, or a molding compound, such as epoxy molding compound (EMC). In yet another embodiment, a highly rigid EMC of a low coefficient of thermal expansion (CTE) is used to form the core substrate. In still another embodiment, the conductive portions 200 are composed of a single conductive pillar or a plurality of conductive pillars stacked on one another.

The circuit structure 2a further comprises a built-up portion 21 disposed on the core layer 20 and having at least one dielectric layer 210 and a plurality of circuit layers 211 bonded to the dielectric layer 210. A plurality of solder pads 212' are disposed on the outmost one of the circuit layers 211 of the chip mounting side 20a of the circuit structure 2a. A plurality of first solder pads 212 (e.g., grounded contacts) and second solder pads 213 (e.g., signal contacts) are disposed on the outermost one of the circuit layers 211 of the ball planting side 20b of the circuit structure 2a. A solder resist layer 22 is formed on the built-up portion 21 on the chip mounting side 20a of the circuit structure 2a. In an embodiment, the dielectric layer 210 is made of a liquid epoxy resin, an ABF film, prepreg, EMC or photosensitive resin. In another embodiment, the solder resist layer 22 is made of graphene, solder ink, solder resist, ABF, a non-photosensitive dielectric material (e.g., EMC), or other suitable materials. A number of the circuit layers 211 can be designed on demands.

A metal sheet 23 is bonded onto the ball planting side 20b of the circuit structure 2a via a bonding material 24. In an embodiment, the metal sheet 23 is a steel board, a nickel alloy (an alloy 42) sheet, etc. In another embodiment, the bonding material 24 is an adhesive material.

In another embodiment, the core layer 20 is replaced by a silicon substrate, and the built-up portion 21 is disposed on the silicon substrate, allowing the circuit structure 2a to become a silicon interposer. In yet another embodiment, the circuit structure 2a is a coreless layer.

Figure 2B:
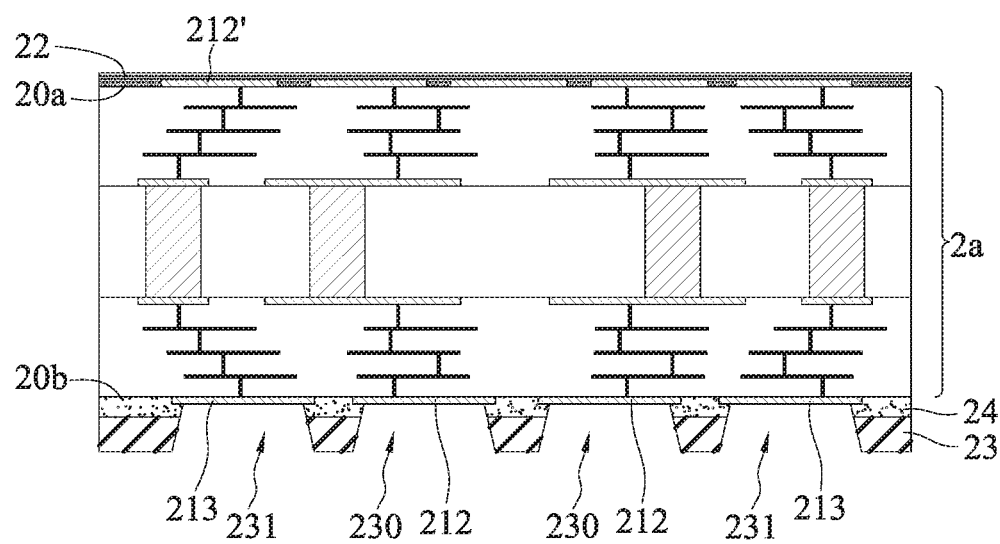

As shown in FIG. 2B, a plurality of first holes 230 and a plurality of second holes 231 are formed on the metal sheet 23 and extended through the bonding material 24, with a portion of the circuit layer (e.g., the first solder pads 212) exposed from the first holes 230 and the second solder pads 213 exposed from the second holes 231.

In an embodiment, the metal sheet 23 is a steel board, a nickel alloy (an alloy 42) sheet, etc. In another embodiment, the bonding material 24 is an adhesive material.

Figure 2C:
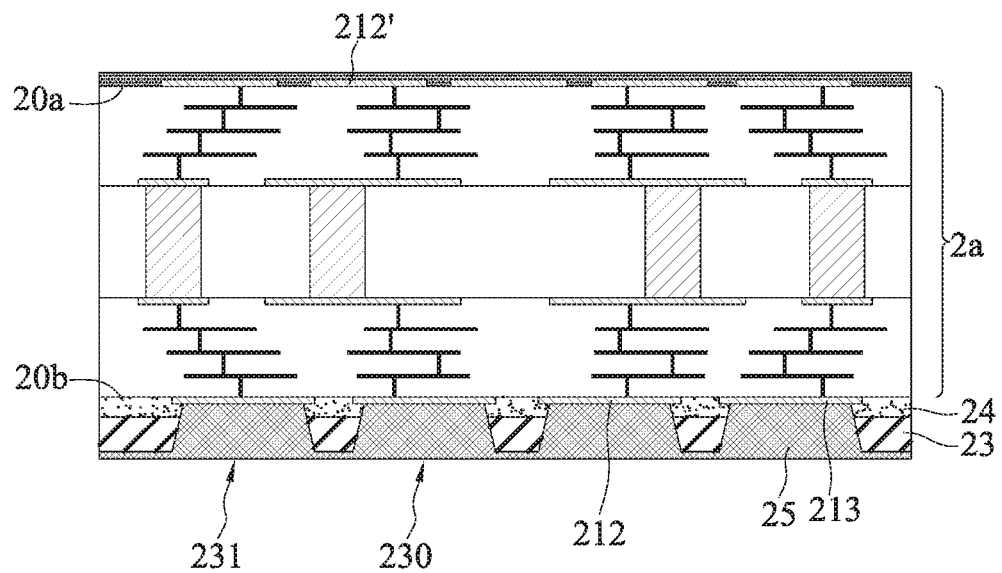

As shown in FIG. 2C, an insulation layer 25 is formed on the first solder pads 212, the second solder pads 213, the metal sheet 23 and in the plurality of first holes 230 and second holes 231.

In an embodiment, the insulation layer 25 is made of a solder resist material having a high heat dissipating rate, such as graphene, or a general solder resist material, such as solder ink, solder mask, ABF or a non-photosensitive dielectric material (e.g., EMC).

Figure 2D:
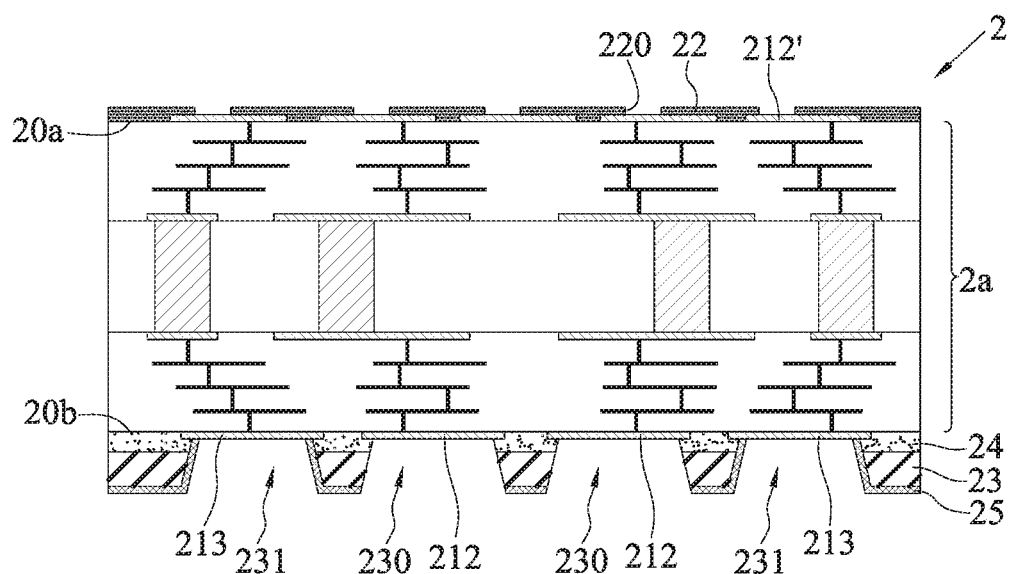
Figure 2D:
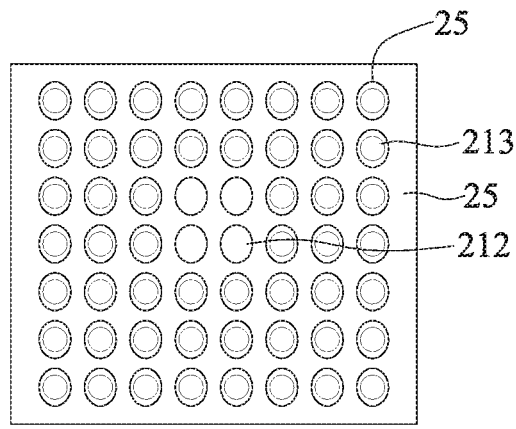

As shown in FIGS. 2D and 2D', a portion of the insulation layer 25 (e.g., the entire insulation layer 25 in the first holes 230 and on the first solder pads 212, and a portion of the insulation layer 25 in the second holes 231 and on the second solder pads 213) is removed, with the insulation layer 25 on the metal sheet 23 and hole walls of the second holes 231 remained, the first solder pads 212 being exposed from the first holes 230, and the second solder pads 213 being exposed from the second holes 231.

In an embodiment, the insulation layer 25 covers the hole walls of the second holes 231 and does not cover the hole walls of the first holes 230, and the insulation layer 25 is not formed in the first holes 230.

In an embodiment, a plurality of holes 220 are formed on the solder resist layer 22, and the solder pads 212' are exposed from the holes 220.

In the semiconductor package substrate 2 according to the present disclosure, the metal sheet 23 is disposed on the ball planting side 20b, and the semiconductor package substrate 2 has the heat dissipating performance improved and temperature rising speed decreased.

Figure 2E:
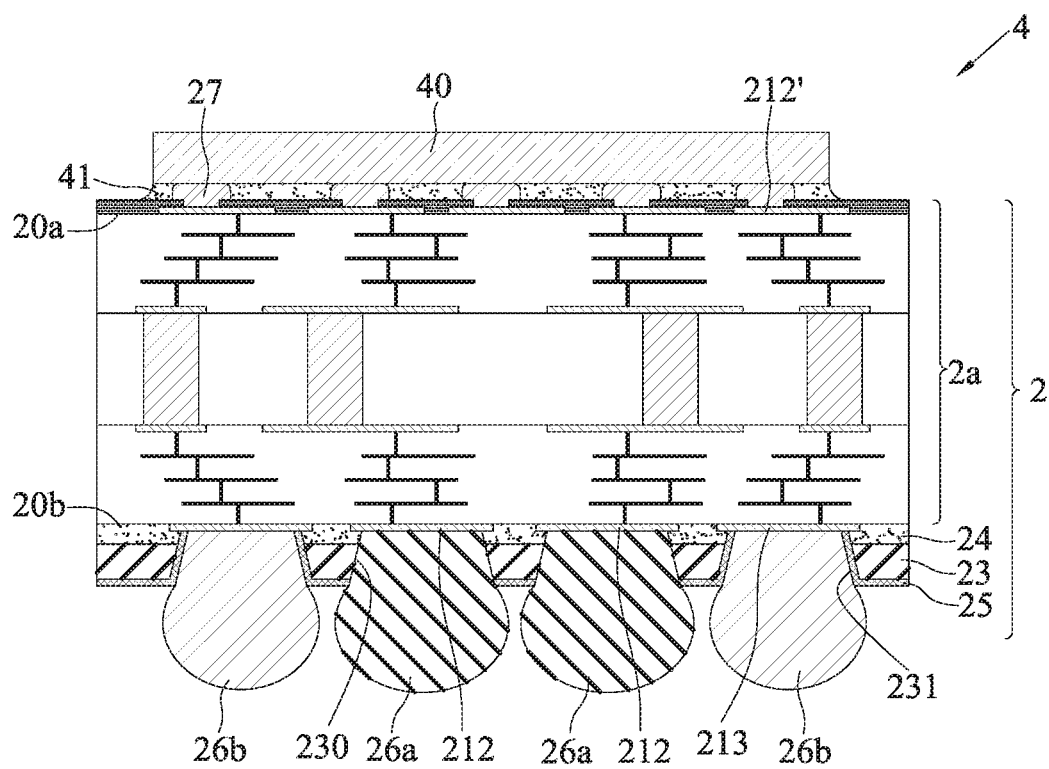

As shown in FIG. 2E, a first conductive element 26a is bonded onto the first solder pads 212 in the first holes 230, and is in contact with the metal sheet 23 and the first solder pads 212; and a second conductive element 26b is bonded onto the second solder pads 213 in the second holes 231, and is in contact with the insulation layer 25 and the second solder pads 213 and in no contact with the metal sheet 23.

In an embodiment, the first and second conductive elements 26a and 26b comprise a solder material, such as solder balls.

At least one electronic component 40 is disposed on the exposed solder pads 212' on the chip mounting side 20a of the circuit structure 2a, and an encapsulation layer 41 is formed on the chip mounting side 20a of the circuit structure 2a and is bonded and secured to the electronic component 40, to form an electronic package 4.

In an embodiment, the electronic component 40 is an active element, such as a semiconductor chip, a passive element, such as a resistor, a capacitor and an inductor, or a combination thereof. In another embodiment, the electronic component 40 is a semiconductor chip electrically connected to the solder pads 212' in a flip-chip manner via a plurality of solder-containing conductive bumps 27. In yet another embodiment, the electronic component 40 is electrically connected to the solder pads 212' in a wire bonding manner via a plurality of solder wires (not shown). The electronic component can also be electrically connected to the semiconductor package substrate 2 in other manners. In still another embodiment, the electronic component is embedded in the built-up portion 21.

In an embodiment, the encapsulation layer 41 is an underfill, and is formed between the chip mounting side 20a of the circuit structure 2a and the electronic component 40 to encapsulate the conductive bumps 27. In another embodiment, the encapsulation layer is a thin film used in a compressing process, an encapsulant used in a molding process, or a glue material used in a printing process, and encapsulates the electronic component 40 and the conductive bumps 27. In yet another embodiment, the encapsulating layer 41 is made of polyimide (PI), epoxy resin, or a molding compound. It should be understood that the electronic component 40 can be packaged in other manners.

In the semiconductor package substrate 2 and the electronic package 4 having the semiconductor package substrate 2 according to the present disclosure, the insulation layer 25 is not formed in the first holes 230 of the metal sheet 23, and the first conductive element 26a that is used to be grounded can be in contact with the metal sheet 23, thereby increasing the heat dissipating speed of the semiconductor package substrate 2. In an embodiment, the electronic package 4 transmits signals from the electronic component 40, through the conductive bumps 27, the solder pads 212', the circuit layers 211 of the built-up portion 21, the conductive portions 200, the circuit layers 211 of the built-up portion 21 and the second solder pads 213 to the second conductive element 26b (or in a reverse order). Therefore, the heat generated during a signal transmission process can be dissipated not only by the metal material (e.g., the copper surface of the circuit layers 211 of the built-up portion 21) and the dielectric layer 210 of the semiconductor package substrate 2, but also by the metal sheet 23 and the first conductive element 26a.

In an embodiment, the insulation layer 25 of the semiconductor package substrate 2 uses a high thermal conductive material (e.g., graphene) as the solder resist layer, and has the thermal conductivity further increased. Therefore, the insulation layer 25 not only has the solder resist function, but can also improve the heat dissipating performance of the semiconductor package substrate 2 and stabilize the overall performance and lifespan of the electronic package 4.

In the semiconductor package substrate 2 and the electronic package 4 having the semiconductor package substrate 2 according to the present disclosure, the first conductive element 26a that is used to be grounded can be in contact with the metal sheet 23 via the structural features inside the metal sheet 23 and the first holes 230, to allow the heat generated during the signal transmission process to be dissipated by the metal sheet 23 and the first conductive element 26a, and thereby improving the heat dissipating performance of the semiconductor package substrate 2. Compared with the prior art, the semiconductor package substrate 2 according to the present disclosure has great heat dissipating performance, and can prevent the entire electronic package 4 from heating up. Therefore, the semiconductor package substrate 2 according to the present disclosure can meet the heat dissipating requirement of the electronic package 4, and ensure the overall performance (e.g., the transmission speed or calculation speed) and lifespan of the electronic package 4.

The foregoing descriptions of the detailed embodiments are illustrated to disclose the features and functions of the present disclosure and not restrictive of the scope of the present disclosure. It should be understood to those in the art that all modifications and variations according to the spirit and principle in the present disclosure should fall within the scope of the appended claims.

What is claimed is:

1. A semiconductor package substrate, comprising:
   a circuit structure having a chip mounting side and a ball planting side opposing the chip mounting side, the circuit structure comprising:
      at least one dielectric layer; and
      a circuit layer formed on the at least one dielectric layer,
   wherein the circuit layer on the ball planting side includes a plurality of first solder pads and a plurality of second solder pads;
   a metal sheet having a plurality of first holes for the first solder pads to be exposed therefrom, and a plurality of second holes for the second solder pads to be exposed therefrom;
   a bonding material bonding the metal sheet onto the ball planting side of the circuit structure, wherein the bonding material is an adhesive material electrically isolating between the metal sheet and the circuit structure;
an insulation layer formed on the metal sheet and a hole wall of each of the second holes, and being free from being formed on a hole wall of each of the first holes;
a plurality of first conductive elements bonded onto the first solder pads in the first holes and being in contact with the metal sheet; and
a plurality of second conductive elements bonded onto the second solder pads in the second holes and being in contact with the insulation layer and in no contact with the metal sheet.

2. An electronic package, comprising:
the semiconductor package substrate of claim 1; and
at least an electronic component disposed on the chip mounting side of the circuit structure.

3. The electronic package of claim 2, further comprising an encapsulation layer formed on the semiconductor package substrate and bonding the electronic component onto the semiconductor package substrate.

4. The electronic package of claim 2, further comprising a plurality of conductive bumps, wherein the electronic component is disposed on the chip mounting side of the circuit structure via the conductive bumps.

5. A method for fabricating a semiconductor package substrate, comprising:
providing a circuit structure having a chip mounting side and a ball planting side opposing the chip mounting side, wherein the circuit structure comprises:
at least one dielectric layer;
a circuit layer formed on the at least one dielectric layer; and
a plurality of first solder pads and a plurality of second solder pads disposed on the circuit layer on the ball planting side;
bonding a metal sheet onto the ball planting side of the circuit structure via a bonding material;
forming on the metal sheet a plurality of first holes for the first solder pads to be exposed therefrom, and a plurality of second holes for the second solder pads to be exposed therefrom;
forming an insulation layer on the ball planting side of the circuit structure and the metal sheet; and
removing a portion of the insulation layer on the first solder pads in the first holes and the second solder pads in the second holes, with the first and second solder pads exposed from the first and second holes, respectively, and the insulation layer remained on a hole wall of each of the second holes.

6. The method of claim 5, further comprising disposing on the first solder pads in the first holes a plurality of first conductive elements in contact with the metal sheet.

7. The method of claim 5, further comprising disposing on the second solder pads in the second holes a plurality of second conductive elements in contact with the insulation layer and in no contact with the metal sheet.

8. The method of claim 5, further comprising disposing a plurality of conductive bumps on the chip mounting side of the circuit structure, and bonding the conductive bumps to an electronic component.

* * * * *